(12) United States Patent
Uchida (10) Patent No.: US 7,834,418 B2
(45) Date of Patent: Nov. 16, 2010

(54) SEMICONDUCTOR DEVICE

(75) Inventor: Shinichi Uchida, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 35 days.

(21) Appl. No.: 12/232,887

(22) Filed: Sep. 25, 2008

(65) Prior Publication Data
US 2009/0085208 A1 Apr. 2, 2009

(30) Foreign Application Priority Data
Sep. 28, 2007 (JP) ............................. 2007-255386

(51) Int. Cl.
*H01L 29/00* (2006.01)
(52) U.S. Cl. ............................ 257/531; 257/E23.015
(58) Field of Classification Search ............... 257/780, 257/784, 786, 778, 531, E23.015, E23.02; 438/612
See application file for complete search history.

(56) References Cited

U.S. PATENT DOCUMENTS

| 6,878,633 B2 * | 4/2005 | Raskin et al. ............... 438/694 |
| 2009/0085208 A1 * | 4/2009 | Uchida ........................ 257/738 |

FOREIGN PATENT DOCUMENTS

JP   2006-311423   11/2006

\* cited by examiner

*Primary Examiner*—Mark Prenty
(74) *Attorney, Agent, or Firm*—McGinn IP Law Group, PLLC (57) ABSTRACT

A semiconductor device (100) includes a semiconductor substrate (2), an inductor (4) provided on the semiconductor substrate (2), a metal ball (8) provided on the inductor (4) so as to come into contact with the inductor (4), and a bonding wire (10) electrically connected to the metal ball (8). The semiconductor device (100) exchanges signals with an external via the inductor (4) and the metal ball (8). The inductor (4) also serves as the bonding pad and therefore the inductor and the bonding pad need not to be arranged in pairs.

16 Claims, 6 Drawing Sheets

SEMICONDUCTOR DEVICE

BACKGROUND OF THE INVENTION

1. Field of the Invention

The present invention relates to a semiconductor device, and more particularly, to a semiconductor device including an inductor.

2. Description of Related Art

In a conventional semiconductor device, an inductor has been used as a constituent of a resonant circuit which is formed by combining an inductive element L of the inductor and a capacitive element C of a capacitor.

Such an inductor is disclosed in JP 2006-311423 A. Specifically, JP 2006-311423 A discloses a resonant circuit including an inductor and a variable capacitance which is formed between the inductor and a plane electrode by providing the plane electrode on the inductor so as to be vertically variable.

In addition to the above-mentioned application, using the inductor included in the semiconductor device for wireless communication between chips has been considered. Besides, using inductive coupling of inductors at a time of a semiconductor device inspection to perform a non-contact inspection has also been considered.

The present inventor has recognized as follows. Regarding the non-contact inspection described above, there arises the following problem. Specifically, an inductor necessary at a time of the inspection and a bonding pad necessary at a time of bonding are both required for each terminal, which causes an increase in chip area, compared with a conventional semiconductor device for which only the bonding pad suffices.

Hereinafter, the above-mentioned problem is described in detail with reference to a drawing.

Figure 6:
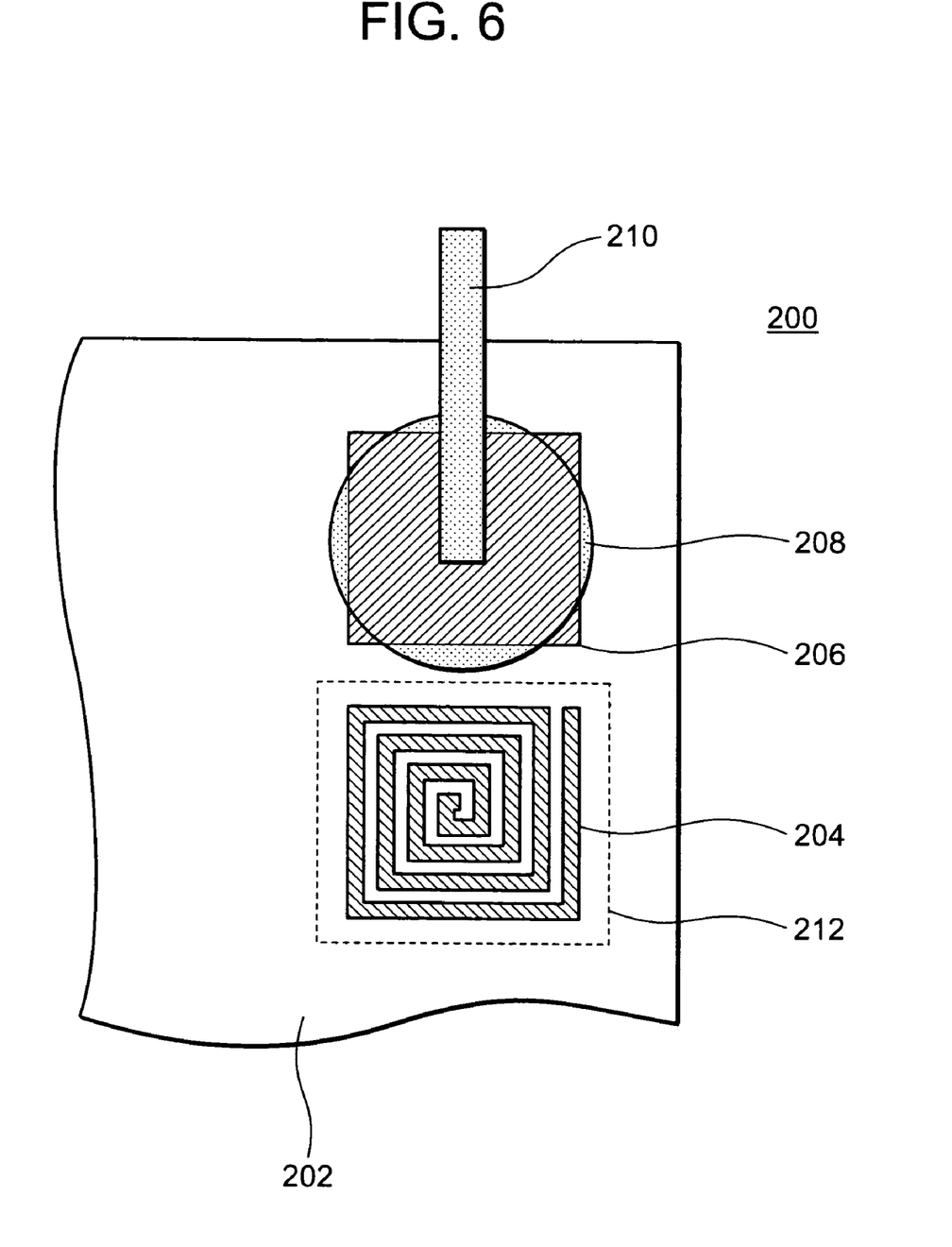
FIG. 6 is a view for describing a problem.

FIG. 6 is a drawing for describing the problem. FIG. 6 is a top view of a semiconductor device 200, and shows a portion (corner portion) of the semiconductor device 200.

The semiconductor device 200 of FIG. 6 is a semiconductor device on which a non-contact inspection can be performed. The semiconductor device 200 includes on a semiconductor substrate 202 an inductor 204 necessary at the time of the non-contact inspection, and a bonding pad 206 necessary at the time of bonding.

Further, the bonding pad 206 is connected to a bonding wire 210 via a metal ball 208. The bonding wire 210 is further connected to an electrode or the like (not shown) of a mounting substrate onto which the semiconductor device 200 is mounted.

The inductor 204 and the bonding pad 206 are used in pairs. Signals from the external are exchanged with an internal circuit (not shown) of the semiconductor device 200 via the inductor 204 at the time of the non-contact inspection, while signals from the external are exchanged with the internal circuit (not shown) of the semiconductor device 200 via the bonding pad 206 after the assembly. Note that, though not shown in FIG. 6, a large number of pairs of the inductor 204 and the bonding pad 206 described above are formed on the semiconductor device 200.

Only the bonding pad 206 suffices in the conventional semiconductor device for which an inspection is performed by bringing a probe into contact with the bonding pad. Meanwhile, in the semiconductor device 200 shown in FIG. 6, for which the non-contact inspection is performed via the inductor 204, a paired inductor 204 is required in addition to the bonding pad 206. Therefore, in order to ensure a space 212 in which the inductor 204 is provided, the chip area is increased, compared with the conventional semiconductor device.

SUMMARY

In view of the above-mentioned problem, the present invention provides a semiconductor device including: a semiconductor substrate; a first inductor provided on the semiconductor substrate; and a metal ball provided on the first inductor so as to come into contact with the first inductor, in which the semiconductor device exchanges signals with an external via the first inductor and the metal ball.

According to the semiconductor device of the present invention, the inductor also serves as a bonding pad, and therefore the inductor and the bonding pad need not to be arranged in pairs. Accordingly, a structure in which the non-contact inspection is enabled can be obtained without causing an increase in chip area.

According to the present invention, the structure in which the non-contact inspection is enabled can be obtained without causing an increase in chip area.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

First Embodiment

A first embodiment of the present invention is described with reference to the drawings.

Figure 1A:
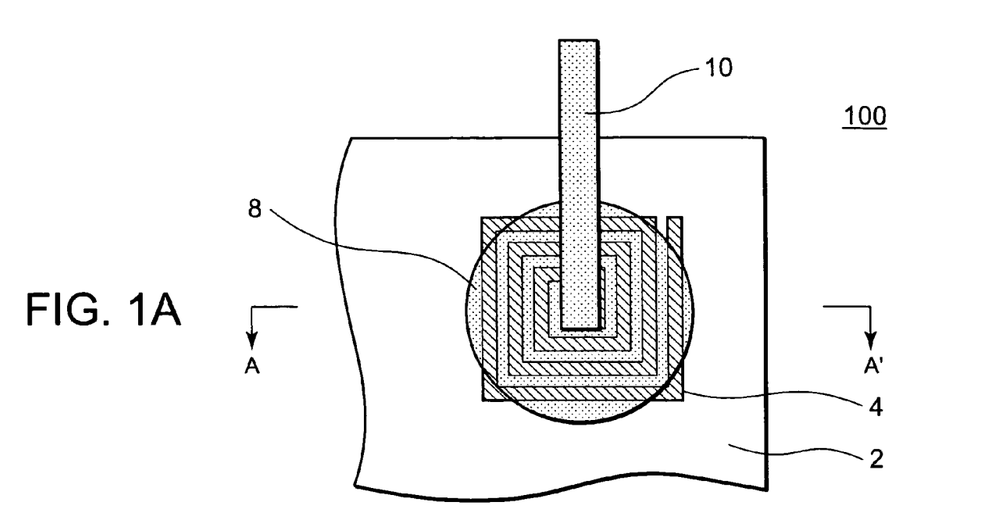
FIG. 1A, FIG. 1B, and FIG. 1C are views showing a first embodiment of the present invention.
Figure 1B:
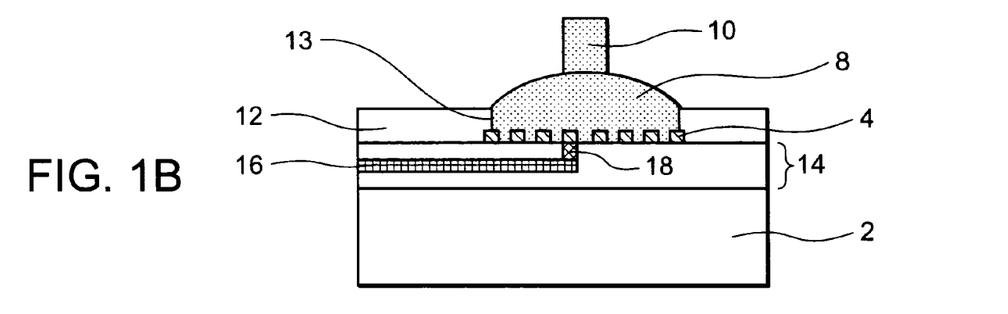
Figure 1C:
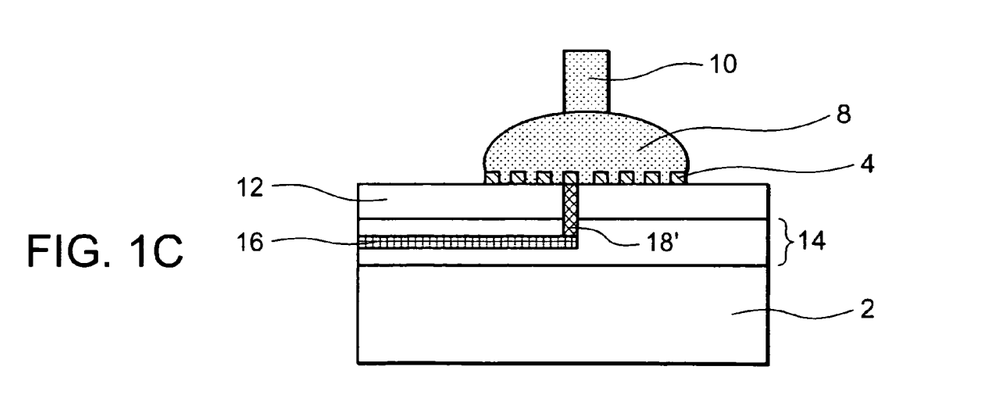

FIGS. 1A to 1C are views showing the first embodiment of the present invention. FIG. 1A shows a top view of a semiconductor device 100 of the first embodiment of the present invention. FIGS. 1B and 1C are sectional views taken along the line A-A' of FIG. 1A.

As shown in FIGS. 1A and 1B, the semiconductor device 100 includes a wiring layer 14 on a semiconductor substrate 2 and an inductor 4 on the wiring layer 14, and has a structure in which a non-contact inspection can be performed. In this case, the wiring layer means an insulating layer formed with wiring and a via therein. The inductor 4 is formed of copper or aluminum, for example.

A central portion of the inductor 4 is electrically connected to wiring 16 formed in the wiring layer 14 via a via plug 18. Further, the wiring 16 is connected to an internal circuit (not shown).

A protective insulating film 12 is formed on the wiring layer 14 and is provided with an opening portion 13 so as to expose at least a portion of the inductor 4.

A metal ball (for example, gold ball or solder ball) 8 is provided on the inductor 4, and the metal ball 8 is electrically connected to the inductor 4. Further, the metal ball 8 is electrically connected to a bonding wire 10.

The metal ball 8 and the bonding wire 10 are mounted onto the semiconductor device 100 in an assembly process performed after the completion of the non-contact inspection. Accordingly, it is apparent that the metal ball 8 and the bonding wire 10 does not inversely affect the non-contact inspection because the inductor 4 is not provided with the metal ball 8 and the bonding wire 10 thereon at the time of the non-contact inspection.

Further, after the non-contact inspection is completed and the metal ball 8 and the bonding wire 10 are mounted onto the semiconductor device 100 in the assembly process, the metal ball 8 and the bonding wire 10 are electrically connected to the internal circuit (not shown) via the inductor 4, the via plug 18, and the wiring 16. Further, the metal ball 8 adheres to respective wires constructing the inductor 4, thereby obtaining a predetermined bonding strength. In other words, the inductor 4 also serves as the bonding pad 206 of FIG. 6.

FIG. 1C is a modification of FIG. 1B. FIG. 1C is different from FIG. 1B in that the inductor 4 is provided on the protective insulating film 12 and that the inductor 4 is connected to the wiring 16 via a via plug 18' passing through the protective insulating film 12. Other configurations of FIG. 1C are the same as those of FIG. 1B.

Next, effects of this embodiment are described below.

In this embodiment, as shown in FIGS. 1A to 1C, the inductor 4 also serves as the bonding pad 206 of FIG. 6, and therefore the inductor and the bonding pad need not to be arranged in pairs. According to the semiconductor device 100 of this embodiment, a structure in which the non-contact inspection is enabled can be obtained without causing an increase in chip area.

Second Embodiment

A second embodiment of the present invention is described with reference to the drawings.

Figure 2A:
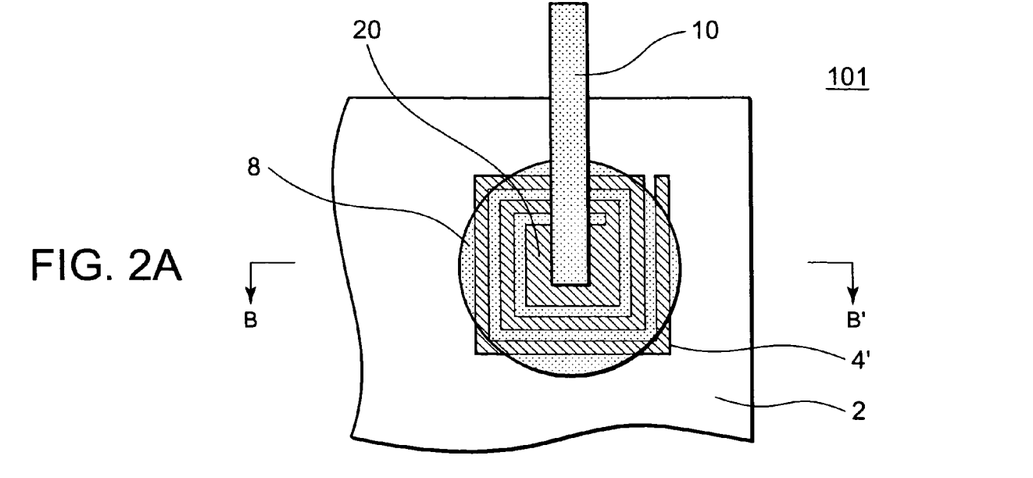
FIG. 2A, FIG. 2B, and FIG. 2C are views showing a second embodiment of the present invention.
Figure 2B:
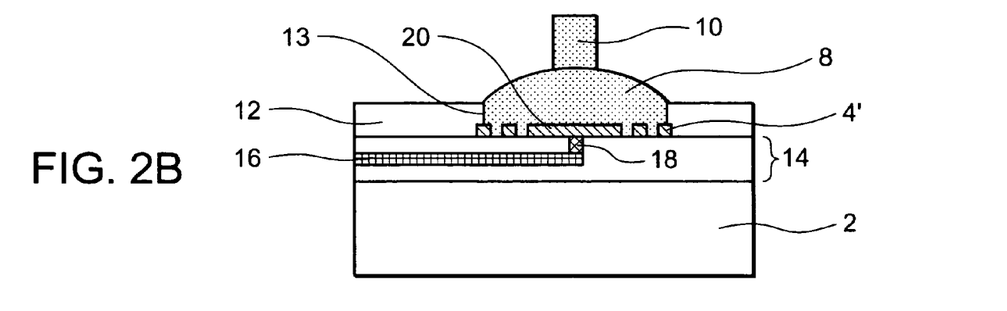
Figure 2C:
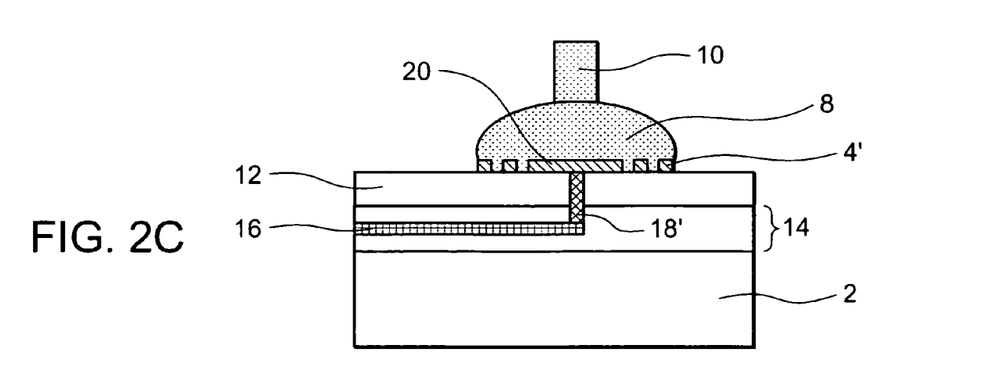

FIGS. 2A to 2C are views showing the second embodiment of the present invention. FIG. 2A is a top view of a semiconductor device 101 of the second embodiment of the present invention. FIGS. 2B and 2C are sectional views taken along the line B-B' of FIG. 2A.

Hereinafter, this embodiment is described with a focus on differences between this embodiment and the first embodiment of the present invention.

As shown in FIGS. 2A and 2B, an inductor 4' provided to the semiconductor device 101 includes a wide wiring portion 20 in a central portion thereof. The wide wiring portion 20 is connected to the wiring 16 via the via plug 18. Further, the wiring 16 is connected to the internal circuit (not shown). Other configurations are the same as those of the first embodiment of the present invention.

FIG. 2C is a modification of FIG. 2B. FIG. 2C is different from FIG. 2B in that the inductor 4' including the wide wiring portion 20 is provided on the protective insulating film 12 and that the wide wiring portion 20 included in the inductor 4' is connected to the wiring 16 via the via plug 18' passing through the protective insulating film 12. Other configurations are the same as those of FIG. 2B.

Next, effects of this embodiment are described.

Also in this embodiment, similarly to the first embodiment of the present invention, the inductor 4' also serves as the bonding pad 206 of FIG. 6 as shown in FIGS. 2A to 2C, and therefore the inductor and the bonding pad need not to be arranged in pairs. According to the semiconductor device 101 of this embodiment as well, the structure in which the non-contact inspection is enabled can be obtained without causing the increase in chip area.

Further, in this embodiment, the central portion of the inductor 4' is provided with the wide wiring portion 20, whereby the adhesion between the metal ball 8 and the inductor 4' can be improved.

Third Embodiment

Subsequently, a third embodiment of the present invention is described with reference to the drawings.

Figure 3A:
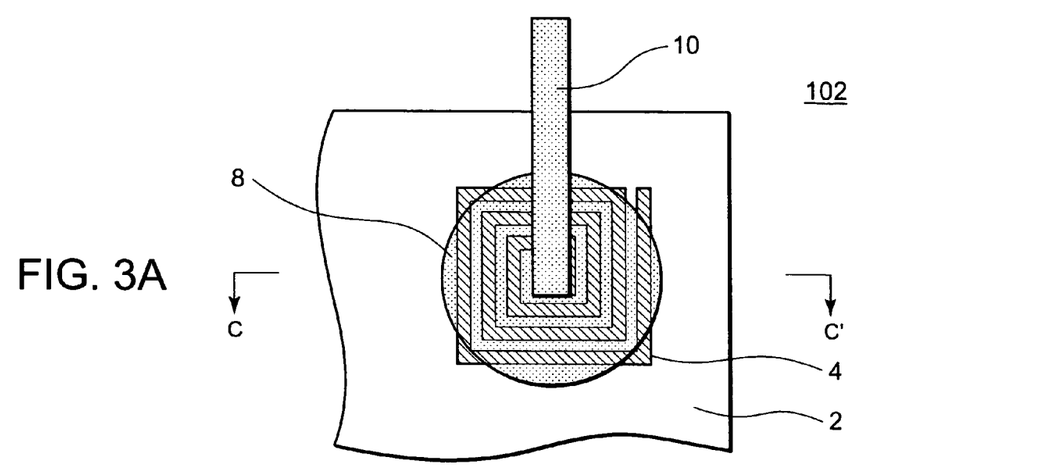
FIG. 3A, FIG. 3B, and FIG. 3C are views showing a third embodiment of the present invention.
Figure 3B:
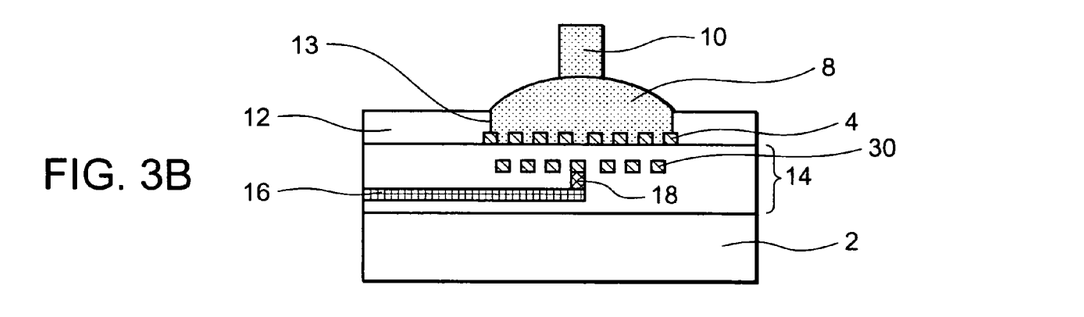
Figure 3C:
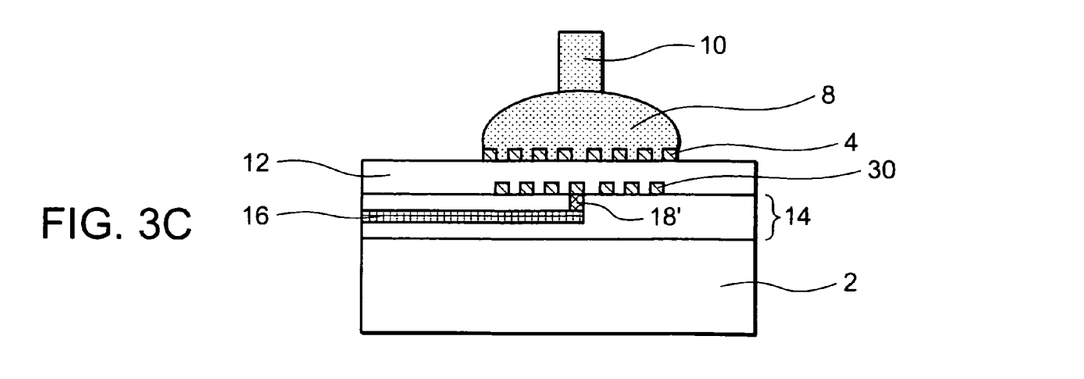

FIGS. 3A to 3C are views showing the third embodiment of the present invention. FIG. 3A is a top view of a semiconductor device 102 of the third embodiment of the present invention. FIGS. 3B and 3C are sectional views taken along the line C-C' of FIG. 3A.

Hereinafter, this embodiment is described with a focus on differences between this embodiment and the first embodiment of the present invention.

As shown in FIGS. 3A and 3B, the semiconductor device 102 further includes another inductor 30 below the inductor 4. The inductor 4 and the inductor 30 are electrically connected to each other. A central portion of the inductor 30 is electrically connected to the wiring 16 formed in the wiring layer 14 via the via plug 18. Further, the wiring 16 is connected to the internal circuit (not shown) In other words, the metal ball 8 and the bonding wire 10 are connected to the internal circuit (not shown) via the inductor 4, the inductor 30, the via plug 18, and the wiring 16. Other configurations are the same as those of the first embodiment of the present invention.

Further, FIG. 3C is a modification of FIG. 3B. FIG. 3C is different from FIG. 3B in that the inductor 4 is provided on the protective insulating film 12 and that the inductor 30 is provided on the wiring layer 14. Other configurations are the same as those of FIG. 3B. Note that, in FIG. 3C, the inductor 30 is arranged on the wiring layer 14, but the inductor 30 may be provided in the wiring layer 14.

Next, effects of this embodiment are described below.

Also in this embodiment, similarly to the first embodiment of the present invention, the inductor 4 also serves as the bonding pad 206 of FIG. 6 as shown in FIGS. 3A to 3C, and therefore the inductor and the bonding pad need not to be arranged in pairs. According to the semiconductor device 102 of this embodiment as well, the structure in which the non-contact inspection is enabled can be obtained without causing the increase in chip area.

Further, in this embodiment, the inductor 30 is provided below the inductor 4, whereby the total number of turns of the inductors are substantially increased. Therefore, there can be achieved more satisfying inductive coupling at the time of the non-contact inspection.

Fourth Embodiment

Next, a fourth embodiment of the present invention is described with reference to the drawings.

Figure 4A:
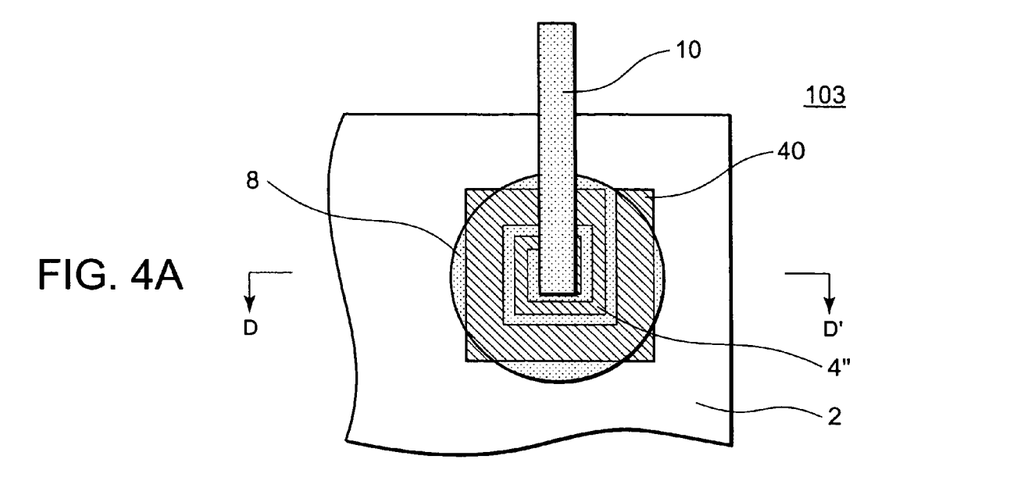
FIG. 4A, FIG. 4B, and FIG. 4C are views showing a fourth embodiment of the present invention.
Figure 4B:
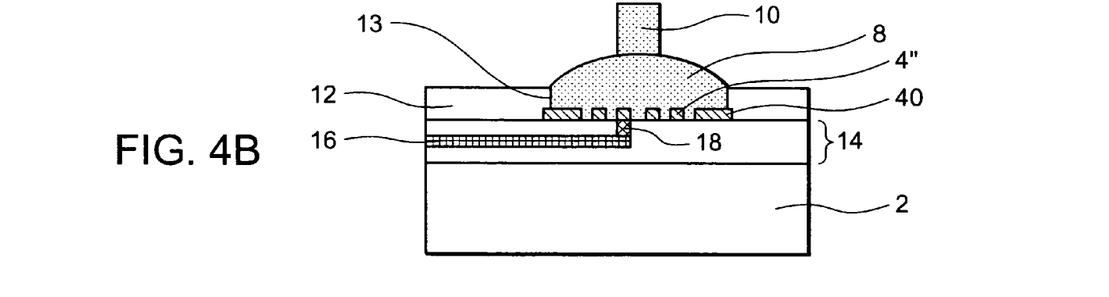
Figure 4C:
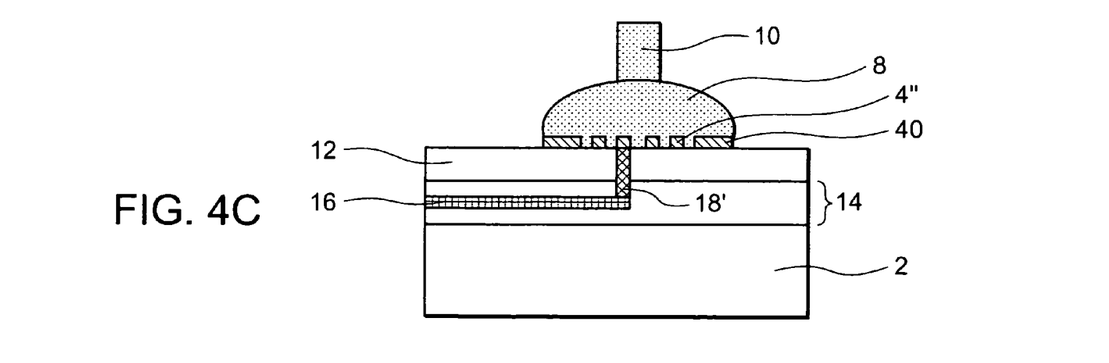

FIGS. 4A to 4C are views showing the fourth embodiment of the present invention. FIG. 4A is a top view of a semiconductor device 103 of the fourth embodiment of the present invention. FIGS. 4B and 4C are sectional views taken along the line D-D' of FIG. 4A.

Hereinafter, this embodiment is described with a focus on differences between this embodiment and the first embodiment of the present invention.

As shown in FIGS. 4A and 4B, an inductor 4" provided to the semiconductor device 103 includes a wide wiring portion 40 in an outer peripheral portion thereof. An arrow wiring portion which is provided in a central portion of the inductor 4" is connected to the wiring 16 via the via plug 18. Further, the wiring 16 is connected to the internal circuit (not shown). Other configurations are the same as those of the first embodiment of the present invention.

The wide wiring portion is provided to the central portion of the inductor 4' in the second embodiment of the present invention, whereas the wide wiring portion is provided to the outer peripheral portion of the inductor 4" in this embodiment.

FIG. 4C is a modification of FIG. 4B. FIG. 4C is different from FIG. 4B in that the inductor 4" including the wide wiring portion 40 is provided on the protective insulating film 12 and that the inductor 4" is connected to the wiring 16 via the via plug 18' passing through the protective insulating film 12. Other configurations are the same as those of FIG. 4B.

Next, effects of this embodiment are described.

Also in this embodiment, similarly to the first embodiment of the present invention, the inductor 4" also serves as the bonding pad 206 of FIG. 6 as shown in FIGS. 4A to 4C, and therefore the inductor and the bonding pad need not to be arranged in pairs. According to the semiconductor device 103 of this embodiment as well, the structure in which the non-contact inspection is enabled can be obtained without causing the increase in chip area.

Moreover, in this embodiment, the wide wiring portion 40 is provided to the outer peripheral portion of the inductor 4". Accordingly, the adhesion between the metal ball 8 and the inductor 4" can be improved.

Fifth Embodiment

A fifth embodiment of the present invention is described with reference to the drawings.

Figure 5A:
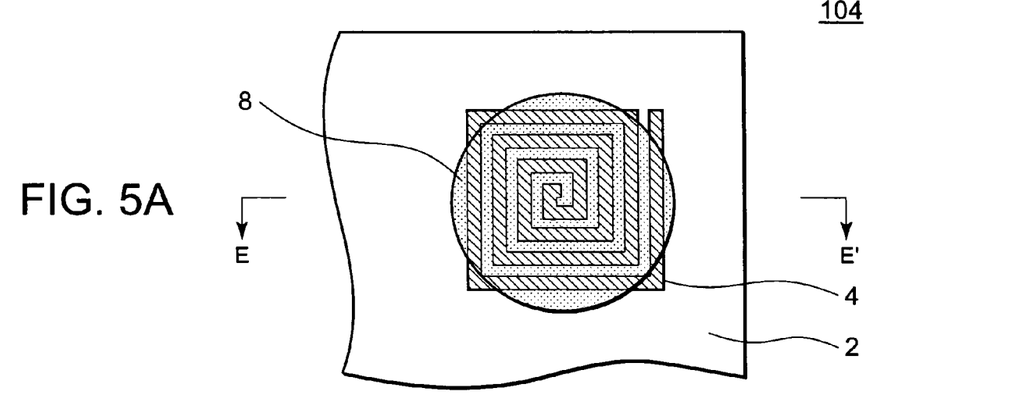
FIG. 5A, FIG. 5B, and FIG. 5C are views showing a fifth embodiment of the present invention.
Figure 5B:
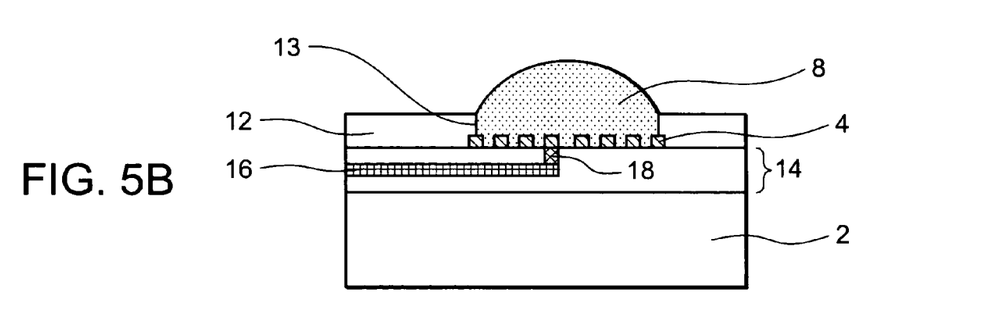
Figure 5C:
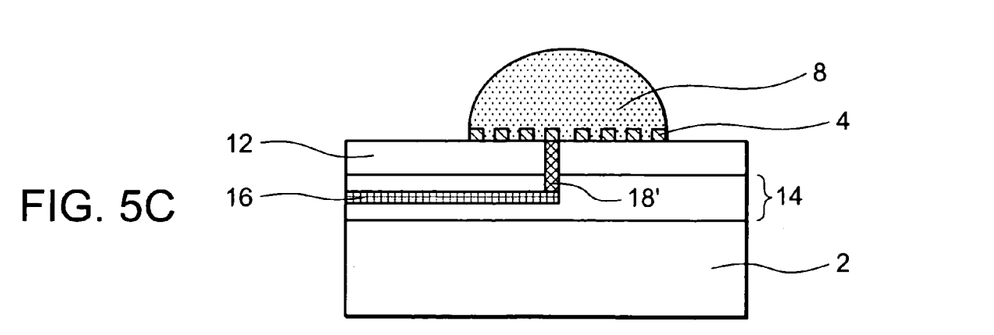

FIGS. 5A to 5C are views showing the fifth embodiment of the present invention. FIG. 5A is a top view of a semiconductor device 104 of the fifth embodiment of the present invention. FIGS. 5B and 5C are sectional views taken along the line E-E' of FIG. 5A.

Hereinafter, this embodiment is described with a focus on differences between this embodiment and the first embodiment of the present invention.

As shown in FIGS. 5A and 5B, in the semiconductor device 104 of this embodiment, a bonding wire is not electrically connected to the metal ball 8, unlike the first embodiment of the present invention. In other words, the semiconductor device 104 of this embodiment has a structure in which flip-chip connection to the mounting substrate is enabled. Other configurations are the same as those of the first embodiment of the present invention.

FIG. 5C is a modification of FIG. 5B. FIG. 5C is different from FIG. 5B in that the inductor 4 is provided on the protective insulating film 12 and that the inductor 4 is connected to the wiring 16 via the via plug 18' passing through the protective insulating film 12. Other configurations are the same as those of FIG. 5B.

Next, effects of this embodiment are described below.

Also in this embodiment, similarly to the first embodiment of the present invention, the inductor 4 also serves as the bonding pad 206 of FIG. 6 as shown in FIGS. 5A to 5C, and therefore the inductor and the bonding pad need not to be arranged in pairs. According to the semiconductor device 104 of this embodiment as well, the structure in which the non-contact inspection is enabled can be obtained without causing the increase in chip area.

Further, in this embodiment, the structure in which flip-chip connection to the mounting substrate is enabled is provided, whereby a mounting process performed on the mounting substrate can be simplified and simultaneously high density mounting can be achieved.

In the above, the respective embodiments of the present invention are described with reference to the drawings, but the present invention is not limited to the above-mentioned embodiments and various changes are applicable thereto.

For example, in the third embodiment of the present invention, providing the inductors arranged in two layers is exemplified, but the inductors arranged in three or more layers may be provided.

Moreover, the above-mentioned embodiments of the present invention can be combined. For example, the inductor 30 exemplified in the third embodiment of the present invention may be provided below the inductor 4' including the wide wiring portion at the central portion thereof which is exemplified in the second embodiment of the present invention. Alternatively, the inductor 30 exemplified in the third embodiment of the present invention may be provided below the inductor 4" including the wide wiring portion at the outer peripheral portion thereof which is exemplified in the fourth embodiment of the present invention.

In addition, the structure exemplified in the fifth embodiment of the present invention, in which a bonding wire is not electrically connected to the metal ball 8, may be applied to the second embodiment to the fourth embodiment of the present invention.

What is claimed is:

1. A semiconductor device, comprising:
    a semiconductor substrate;
    a first inductor provided on the semiconductor substrate;
    a metal ball provided on the first inductor so as to come in contact with the first inductor; and
    a bonding wire electrically connected to the metal ball,
    wherein the semiconductor device exchanges signals with an external via the first inductor, the metal ball, and the bonding wire.

2. A semiconductor device according to claim 1, wherein the first inductor comprises a first wiring arranged in a spiral shape.

3. A semiconductor device according to claim 2, wherein the first wiring has different widths at a central portion of the first inductor and an outer peripheral portion of the first inductor.

4. A semiconductor device according to claim 3, wherein the first wiring has a wider width at the central portion of the first inductor than a width of the first wiring at the outer peripheral portion of the first inductor.

5. A semiconductor device according to claim 3, wherein the first wiring has a wider width at the outer peripheral portion of the first inductor than a width of the first wiring at the central portion of the first inductor.

6. A semiconductor device according to claim 1, further comprising a second inductor provided below the first inductor.

7. A semiconductor device according to claim 6, wherein the second inductor comprises a second wiring arranged in a spiral shape.

8. A semiconductor device according to claim 6, wherein the first inductor and the second inductor are electrically connected to each other.

9. A semiconductor device according to claim 1, further comprising a wiring layer provided on the semiconductor substrate, wherein the first inductor is provided on the wiring layer.

10. A semiconductor device according to claim 9, wherein:

the wiring layer comprises a third wiring; and the first inductor is electrically connected to the third wiring.

11. A semiconductor device according to claim 10, wherein:

the wiring layer comprises a via plug; and the first inductor is electrically connected to the wiring via the via plug.

12. A semiconductor device according to claim 9, further comprising a protective insulating film provided on the wiring layer.

13. A semiconductor device according to claim 12, wherein the protective insulating film comprises an opening portion to expose at least a portion of the first inductor.

14. A semiconductor device according to claim 12, wherein the first inductor is provided on the protective insulating film.

15. A semiconductor device, comprising:

a semiconductor substrate;

a first inductor provided on the semiconductor substrate; and a metal ball provided on the first inductor so as to come into contact with the first inductor, wherein the semiconductor device exchanges signals with an external via the first inductor and the metal ball, and the metal ball is contacted to a plurality of different parts of the first inductor.

16. The semiconductor device according to claim 15, wherein the metal ball is contacted to a top surface of the first inductor and a side surface of the first inductor.

* * * * *